United States Patent
Ross

(10) Patent No.: US 10,990,471 B2
(45) Date of Patent: Apr. 27, 2021

(54) APPARATUS AND METHOD FOR REDUCING RADIATION INDUCED MULTIPLE-BIT MEMORY SOFT ERRORS

(71) Applicant: BAE SYSTEMS Information and Electronic Systems Integration Inc., Nashua, NH (US)

(72) Inventor: Jason F. Ross, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 2 days.

(21) Appl. No.: 16/425,377

(22) Filed: May 29, 2019

(65) Prior Publication Data

US 2020/0379842 A1    Dec. 3, 2020

(51) Int. Cl.
*G06F 11/00*    (2006.01)
*G06F 11/10*    (2006.01)
(Continued)

(52) U.S. Cl.
CPC ........ *G06F 11/1016* (2013.01); *G06F 1/3206* (2013.01); *G06F 1/3287* (2013.01);
(Continued)

(58) Field of Classification Search
None
See application file for complete search history.

(56) References Cited

U.S. PATENT DOCUMENTS 4,130,892 A    12/1978  Gunckel, II et al.
4,434,459 A  *  2/1984  Holland ................. G06F 9/268
                                                711/E12.097
(Continued)

FOREIGN PATENT DOCUMENTS

EP    0432846 A1    6/1991
EP    2115746 A4    2/2007
(Continued)

OTHER PUBLICATIONS

M. Zhu, L. Xiao, S. Li and Y. Zhang, "Efficient Two-Dimensional Error Codes for Multiple Bit Upsets Mitigation in Memory," 2010 IEEE 25th International Symposium on Defect and Fault Tolerance in VLSI Systems, Kyoto, Japan, 2010, pp. 129-135, doi: 10.1109/DFT.2010.22. (Year: 2010).*

(Continued)

*Primary Examiner* — Daniel F. McMahon
(74) *Attorney, Agent, or Firm* — Maine Cernota & Rardin; Scott J. Asmus

(57) ABSTRACT

A disclosed apparatus and method reduce the likelihood of multiple bit single event upset (SEU) errors in space-deployed memory devices and memory macros. For each memory, a bit selection layer effectively increases the mux of the memory bit table, thereby reducing the word size while increasing the word capacity, without changing the total memory capacity. As a result, the separation between the physical bit storage locations for each word is increased, thereby reducing the likelihood of multiple bit SEU errors. A buffer can be implemented if the memory lacks individual bit write control. The memory can be implemented in a core integrated circuit (IC) of an multi-chip module (MCM) hybrid integrated circuit (HIC), and the bit selection layer and/or buffer can be implemented in a chiplet or chiplets of the MCM-HIC.

12 Claims, 6 Drawing Sheets

(51) Int. Cl.
  *G11C 11/56* (2006.01)
  *G06F 1/3287* (2019.01)
  *G11C 11/16* (2006.01)
  *G06F 1/3206* (2019.01)

(52) U.S. Cl.
  CPC ...... *G06F 11/1068* (2013.01); *G11C 11/1655* (2013.01); *G11C 11/1657* (2013.01); *G11C 11/5628* (2013.01)

(56) References Cited

U.S. PATENT DOCUMENTS

| | | | |
|---|---|---|---|
| 5,117,129 | A | 5/1992 | Hoffman |
| 5,438,437 | A | 8/1995 | Sasaki |
| 5,629,634 | A | 5/1997 | Carl |
| 5,867,039 | A | 2/1999 | Golke |
| 5,907,865 | A * | 5/1999 | Moyer .................. G06F 7/768 711/201 |
| 6,111,780 | A | 8/2000 | Bertin |
| 6,311,258 | B1 * | 10/2001 | Gibson ................. G06F 9/3879 711/200 |
| 6,845,054 | B2 | 1/2005 | Lovett |
| 7,408,410 | B2 | 8/2008 | Wood |
| 8,487,649 | B2 | 7/2013 | Konishi |
| 8,778,755 | B2 | 7/2014 | Ross |
| 8,975,920 | B2 | 3/2015 | Bansal |
| 8,977,933 | B2 * | 3/2015 | Cloetens ................. G06F 21/79 714/773 |
| 10,135,443 | B1 | 11/2018 | Ross |
| 2002/0024098 | A1 | 2/2002 | Eimori |
| 2003/0020160 | A1 | 1/2003 | Deeney |
| 2007/0285851 | A1 | 12/2007 | Hillman et al. |
| 2010/0039030 | A1 | 2/2010 | Winters et al. |
| 2012/0212465 | A1 | 8/2012 | White |
| 2017/0316829 | A1 * | 11/2017 | Ehrman .................. G11C 7/18 |
| 2019/0221556 | A1 | 7/2019 | Gomes |
| 2019/0311765 | A1 * | 10/2019 | Lin .......................... G11C 8/14 |
| 2020/0051961 | A1 * | 2/2020 | Rickard ................. H01L 23/04 |

FOREIGN PATENT DOCUMENTS

| | | |
|---|---|---|
| EP | 2126921 A4 | 10/2010 |
| WO | 2008118553 A2 | 10/2008 |
| WO | 2008140643 A2 | 11/2008 |

OTHER PUBLICATIONS

European Search Report for Appl No. EP08794298 dated Oct. 25, 2010, 2 pages.
European Search Report for Appl No. EP08780420 dated Oct. 27, 2010, 4 pages.
Lapedus; Mark, The Chiplet Race Begins, Semiconductor Engineering, Aug. 6, 2018, https://semiengineering.com/the-chiplet-race-begins/, 13 pages.
Mutschlir; Ann Steffora, DARPA CHIPS Program Pushes for Chiplets, Semiconductor Engineering, Sep. 14, 2017, https://semiengineering.com/darpa-chips-program-pushes-for-chiplets/, 6 pages.
Notice of Allowance dated Jun. 17, 2020 for U.S. Appl. No. 16/422,072, 28 Pages.

* cited by examiner

APPARATUS AND METHOD FOR REDUCING RADIATION INDUCED MULTIPLE-BIT MEMORY SOFT ERRORS

FIELD

The disclosure relates to computing devices, and more particularly to apparatus and methods for minimizing errors when storing and retrieving data in computing devices.

BACKGROUND

Many computing devices require access to high density, high speed electronic memory, which can be provided as dedicated high density integrated circuits (memory "chips") as well as high speed, low latency internal memory "macros" that are included, for example as cache memory, within a larger integrated circuit. All such devices are referred to generically herein as "memory devices," or simply as "memories." Typically, successful operation of the computing device depends upon the ability to store data in the memory and retrieve the data therefrom rapidly and in large quantities, with virtually no errors. To that end, such memories often include error detection features such as the ability to generate and store "parity" bits, so that the rare occurrence of a memory error can be detected, and so that program operation can be halted and/or other corrective action can be taken when an error does occur.

Improvements in lithography, clean room technology, and other integrated circuit manufacturing methodologies have greatly reduced the presence of manufacturing defects in memory devices that might lead to defect-related errors and failures, sometimes referred to as "hard" errors. However, memory errors can sometimes occur due to environmental factors. In particular, exposure to electromagnetic noise or radiation can cause memory devices to experience so-called "soft" errors, whereby memory content is spontaneously and randomly changed without the presence of a hardware defect, and without the occurrence of any permanent damage to the device. For this reason, in applications that require a very high degree of reliability, efforts are typically made to avoid these environmental sources of soft errors. For example, care is usually taken not to locate a computing device near to an electric motor, microwave transmitter, electron beam devices that generate ionizing radiation, and/ or other environmental sources of electromagnetic energy and/or radiation. And when such sources cannot be avoided, as for example in some military applications, efforts are made to shield the electronic memory devices from these causes of soft errors.

However, in certain applications, such as in space-based applications, exposure to cosmic rays and other forms of radiation can be unavoidable, and can lead to a specific type of soft error that is referred to as a "single event upset" (SEU) or simply as an "upset," wherein one or more bits are changed due to impact of a single cosmic ray, without damage to the device itself. Unfortunately, it can be difficult and/or cost prohibitive to provide radiation "hardening" that will adequately protect electronic memory devices from SEUs. For that reason, such devices often implement protocols that not only detect SEU memory errors, but also correct such errors. Examples include implementations of "Hamming" codes, such as "Single Error Correction and Double Error Detection" (SECDED), which impose a relatively minimal speed and memory size burden.

However, SECDED and similar error correction methods are often unable to provide correction of "multi-bit" errors, i.e. when more than one upset occurs in a given data entry within the memory. SECDED, in particular, is able to detect and "flag" instances where two separate bits within a data entry are changed due to SEUs. However, SECDED is not able to correct the errors when two bits in a data entry (such as a word or byte) have been changed by an SEU.

In some relatively mature memory designs, having resolutions for example of 0.5 um or greater, the impact region for a single cosmic ray or other radiation event can be smaller than the area that is occupied by a single bit, thereby reducing the likelihood of multi-bit errors resulting from a single radiation "impact." However, as devices have become more highly integrated, and the internal dimensions have been scaled to ever smaller dimensions, it has become more common for individual radiation impacts to affect a plurality of proximal memory bits, and thereby to generate a plurality of bit errors in a single data entry. Furthermore, as density requirements have increased, dynamic random access memory (DRAM) has become preferred over other static random access memory (SRAM), because fewer transistors are required. In DRAM, elemental data bits are represented by small packets of spatially localized charge, which can be highly sensitive to cosmic rays and other radiation impacts, further increasing the likelihood of multi-bit errors.

As a result, relatively simple error correction methods based on Hamming codes, such as SECDED, have become increasingly insufficient. Instead, some applications implement more sophisticated error detection and correction (EDAC) methods, such as redundant storage of data, that are able to correct "multi-bit" SEU errors, i.e. SEU errors that affect more than one bit in a given data entry. However, while these approaches can be effective, they can significantly increase cost and/or significantly reduce system performance.

One approach would be to design special memory devices that implement a memory storage technology that is less vulnerable to radiation and/or are otherwise designed to be less vulnerable to radiation impacts. However, space-based, military, and many other radiation-sensitive applications tend to be specialized, such that devices are needed in low volumes, rendering design and manufacture of novel memory devices cost prohibitive.

What is needed, therefore, is an apparatus and method for increasing the reliability of high density memory devices when subject to radiation exposure, without incurring the high costs and/or performance loss associated with sophisticated EDAC approaches, and without requiring design of novel, special purpose high density memory devices.

SUMMARY

The present disclosure is an apparatus and method for increasing the reliability of high density memory devices when subject to environmental or radiation exposure, without incurring the high costs and/or performance loss associated with sophisticated EDAC approaches, and without requiring design of novel, special purpose high density memory devices.

The physical locations where bits are stored in a conventional memory device, such as a DRAM, are typically arranged in physical rows and columns, referred to herein as a "bit table." In the simplest case, each row of the bit table can represent a data entry, referred to generically herein as a "word," while each column represents a bit of the word. So, for example, a 4 kByte memory, where each data entry "word" includes eight bits (i.e. each word includes one byte), could comprise a bit table having 4096 rows and eight columns. In this simple case, all of the addressing bits (12 bits) would be used to select a row in the table, and the outputs of all of the columns would represent the bits of the selected word.

More generally, with reference to FIG. 1, the data stored in the bit table 100 of a memory device can be "multiplexed," whereby each row 102 of the bit table 100 includes bits that belong to more than one word. In the example of FIG. 1, the bit table 100 includes 8 rows and 8 columns. Two columns are assigned to each bit, such that the bit table 100 is configured to store sixteen 4-bit "words." In this case, the columns would be paired, with the outputs of each pair being directed to a 2:1 bit selection device (not shown). Three address bits would be needed to select a desired row, and one additional bit would be used to select whether the "odd" or "even" columns should be accessed. In FIG. 1, the four bits 104 assigned to the lowest address, i.e. address 0,0,0,0 (binary) have been filled in.

Similarly, a 4 Kbyte memory could include a table having 2048 rows and 16 columns. The highest order 11 address bits would be used to select a row, and the lowest order address bit would be used to control the selection devices assigned to the column pairs, so as to determine whether the "left" column or the "right" column of each pair was accessed. Obviously, this approach can be extended, whereby four, eight, or more columns are assigned to each bit. The number of columns that are assigned to each bit is referred to as the "column mux" of the memory.

FIG. 2 illustrates an example of a device 200 that comprises a bit table 100 having 128 rows and 32 columns, wherein 8 columns are assigned to each bit, so that the memory capacity is 1024 4-bit "words." The primary control inputs 202 include seven addressing bits (0-6). An additional 3 addressing bits 204 (7-9) are directed to a series of 8:1 select devices 206 that select a desired bit from among the eight columns assigned to that bit in a selected row.

According to this typical memory storage approach, the column mux determines the spacing between the bit storage locations that are assigned to a given data entry, with the bits being assigned to sequential, adjacent locations in a given row if the column mux is one, to every other location in the row if the column mux is two, etc. It can be seen for example in FIG. 1, which has a column mux of 2, that the bits 104 belonging to a specific entry (0,0,0,0) are spaced one column apart. For some memory devices, especially many high density memory devices, the column selecting logic is programmable, such that a so-called "memory compiler" can be used select a desired column mux. Typical column mux selections are 2, 4, 8, 16, and 32. Accordingly, the vulnerability of such devices to radiation-induced soft errors can be reduced somewhat by selecting the maximum allowed column mux, so that the bits belonging to a single data entry are separated as widely as possible.

However, for some applications selecting the largest allowed column mux is insufficient, and for many other devices that are desirable for space-based and other applications, the column mux is fixed.

According to the present disclosure, a low density bit selection hardware layer is implemented external to a memory device that serves to increase the effective column mux of the device, thereby increasing the separation between bits that belong to the same word, so as to reduce the likelihood of multi-bit SEU errors caused by radiation impacts. Because the number of bit table rows is fixed for a given device, the bit selection layer of the present disclosure has the effect of increasing the number of words that are stored by a given device at the expense of the bit size of the words. However, the net storage capacity of the device is preserved, and the bit selection layer imposes almost no speed, power, or space penalty on the apparatus.

As an example, an 8 Kbyte memory could comprise two chips or two embedded macros within a larger chip, each having a capacity of 4 Kbyte, organized as 2K rows and 16 columns, whereby the first chip or macro stores the first 4 Kbytes of the memory, and the second chip or macro stores the second 4 Kbytes of the memory. The lowest 12 addressing bits could be routed to each of the two chips or macros, and the highest order addressing bit could be directed to an external 16:8 selecting device so as to select which of the chip or macro outputs should be accessed.

According to the present disclosure, the external 16:8 selecting device could be replaced by a bit selection layer comprising sixteen 2:1 select devices, essentially converting each of the chips or macros into an 8 K×4 bit memory. As a result, only 4 bits would be selected from each of the two chips or macros, with both chips or macros contributing to each word that was accessed. As a result, the net memory capacity would be the same, the bit selection logic would be changed, but similar in complexity, and each of the bits belonging to each word would be separated from its neighbors by four columns instead of two.

With reference to co-pending patent application Ser. No. 16/057,204, which is incorporated herein by reference in its entirety for all purposes, and which has a common Applicant with the present application, in embodiments the memory device is a "core IC" included in a multi-chip module ("MCM") hybrid integrated circuit ("HIC") device, and the bit selection layer is implemented in a chiplet included in the same MCM-HIC device.

As is disclosed in more detail in U.S. application Ser. No. 16/057,204, MCM-HIC devices represent a flexible approach to enhancing and/or modifying the functionality of an existing "core" IC, typically a VLSI IC or other high density, high complexity IC, in cases where the quantity requirements of an application do not justify designing and manufacturing a new high density circuit. According to the MCM-HIC approach, one or more existing core ICs are installed on an interconnecting substrate together with at least one "chiplet" that provides the required features and/or adaptations that are lacking from the core ICs. Often, the chiplets are interposed between the core IC(s) and the inputs and outputs of the MCM-HIC. The chiplets are typically lower density, lower complexity circuits that can be economically designed and manufactured in lower quantities as needed. Often, a new requirement can be met simply by designing a new substrate that will provide the required interconnections between existing core ICs and previously designed chiplets.

One general aspect of the present disclosure is a memory apparatus having a reduced likelihood of multiple bit single event upset (SEU) errors. The memory apparatus includes a memory configured to store bits within a bit table having a column mux M, where M is an integer, said memory including data bit outputs and data bit inputs, and a bit selection layer external to the memory and cooperative with the data bit outputs and the data bit inputs, the bit selection layer being configured to increase an effective column mux of the bit table, so that for each word of data stored in the bit table, a physical separation between bits belonging to the word is increased.

In embodiments, the memory is configured for storing N words, where N=2 raised to the power n, each of the words having a bit length L, where L=2 raised to the power m, and the memory includes n memory address bit inputs, L memory data bit outputs, and L memory data bit inputs. The bit table has R rows and C columns, wherein N×L=R×C, where a column mux M of the bit table satisfies a relation M=N/R, the columns being organized into a plurality of adjacent groups of M columns each, such that storage of a word in the memory includes storage of the word in a selected row of the bit table with the bits of the word being stored in each of L consecutive column groups of the plurality of column groups, the bit selection layer is in data communication with the L memory data bit outputs and L memory data bit inputs of the memory, the bit selection layer having a selection factor D=2 raised to the power s. The bit selection layer includes s layer address bit inputs, where s is less than m, S layer data inputs, where S=L/D, and S layer data outputs, and the bit selection layer is configured to: select one of the memory data bit inputs and outputs from each consecutive group of D memory data bit inputs and outputs respectively according to bit selection address bits applied to the layer address bit inputs, direct write bits presented to the layer data inputs to the selected memory data bit inputs, and direct read bits from the selected memory data bit outputs to the layer data outputs, where N, L, n, R, C, M, D, s, and S are all integers.

Any of the above embodiments can further include a buffer layer interposed between the bit selection layer and the memory, the buffer layer being configured to read, write, and store an entire word to and from the memory, said buffer layer providing individual write control of each bit of the word.

In any of the above embodiments, the memory can be a DRAM, SRAM, NAND/NOR FLASH, MRAM, CRAM, or FeRAM memory.

In any of the above embodiment, the apparatus can include a plurality of the memories and a corresponding plurality of the bit selection layers.

In any of the above embodiments, the memory can be implemented in a core IC within a multi-chip module (MCM) hybrid integrated circuit (HIC), and the bit selection layer is implemented in a chiplet that is also installed within the MCM-HIC. In some of these embodiments, the memory is a non-volatile memory, and the MCM-HIC further implements cold spare operation, thereby enabling the likelihood of multi-bit SEU errors to be further reduced by withdrawing power from the core IC when the core IC is not in use.

A second general aspect of the present disclosure is a method of reducing a likelihood of radiation-induced multi-bit SEU errors of a memory apparatus that includes a plurality of memories that are selectable according to at least one memory selection addressing bit. The method includes for each of the memories, providing a bit selection layer external to the memory that is configured to select a subset of inputs and outputs of the memory for data input and output according to at least one layer addressing bit applied to a layer address input of the bit selection layer, and redirecting at least one of the memory selection addressing bits to the layer address inputs, so as to control the selections of the subsets of inputs and outputs of the memories by the external bit selection layers.

In embodiments, each of the memories is configured for storing N words, where N=2 raised to the power n, each of the words having a bit length L, where L=2 raised to the power m, and each of the memories includes n memory address bit inputs, L memory data bit outputs, and L memory data bit inputs. The bit table has R rows and C columns, wherein N×L=R×C, where the column mux M of the bit table satisfies the relation M=N/R, the columns being organized into a plurality of adjacent groups of M columns each, such that storage of a word in the memory includes storage of the word in a selected row of the bit table with the bits of the word being stored in each of L consecutive column groups of the plurality of column groups. The bit selection layer is in data communication with the L memory data bit outputs and L memory data bit inputs of the memory, the bit selection layer having a selection factor D=2 raised to the power s. Each of the bit selection layers includes s layer address bit inputs, where s is less than m, S layer data inputs, where S=L/D, and S layer data outputs. Each of the bit selection layers is configured to select one of the memory data bit inputs and outputs from each consecutive group of D memory data bit inputs and outputs respectively according to bit selection address bits applied to the layer address bit inputs, direct write bits presented to the layer data inputs to the selected memory data bit inputs, and direct read bits from the selected memory data bit outputs to the layer data outputs, where N, L, n, R, C, M, D, s, and S are all integers.

Either of the above embodiments can further include buffer layers interposed between the bit selection layers and the corresponding memories, each of the buffer layers being configured to read, write, and store an entire word to and from the corresponding memory while providing individual write control of each bit of the word, and wherein writing a word to one of the memories includes reading a word from the memory into the buffer layer, altering the word in the buffer layer by changing selected bits of the word in the buffer layer, and writing the altered word from the buffer layer into the memory.

In any of the above embodiments, each of the memories can be a DRAM, SRAM, NAND/NOR FLASH, MRAM, CRAM, or FeRAM memory.

In any of the above embodiments, the memory can be implemented in a core IC included in a multi-chip module (MCM) hybrid integrated circuit (HIC), and wherein the bit selection layer is implemented in a chiplet that is also installed within the MCM-HIC.

And in any of the above embodiments the memory can be a non-volatile memory, and wherein the MCM-HIC further implements cold spare operation, thereby enabling the likelihood of radiation-induced multi-bit SEU errors to be further reduced by withdrawing power from the core IC when it is not in use.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present disclosure is directed to an apparatus and method for increasing the reliability of high density memory devices when subject to environmental conditions such as radiation exposure, without incurring the high costs and/or performance loss associated with sophisticated EDAC approaches, and without requiring design of novel, special purpose high density memory devices.

According to the present disclosure, the effective column mux of a memory device is increased by implementing a low density bit selection hardware layer external to a memory device, thereby increasing the separation between bits that belong to the same word so as to reduce the likelihood of multi-bit SEU errors caused by radiation impacts. Because the number of bit table rows is fixed for a given device, the bit selection layer of the present disclosure has the effect of increasing the number of words that are stored by a given device at the expense of the bit size of the words. However, the net storage capacity of the device is preserved, and the bit selection layer imposes almost no speed, power, or space penalty on the apparatus, while increasing the separation between bits belonging to the same word, and thereby reducing the likelihood of multi-bit SEU errors.

Figure 3A:
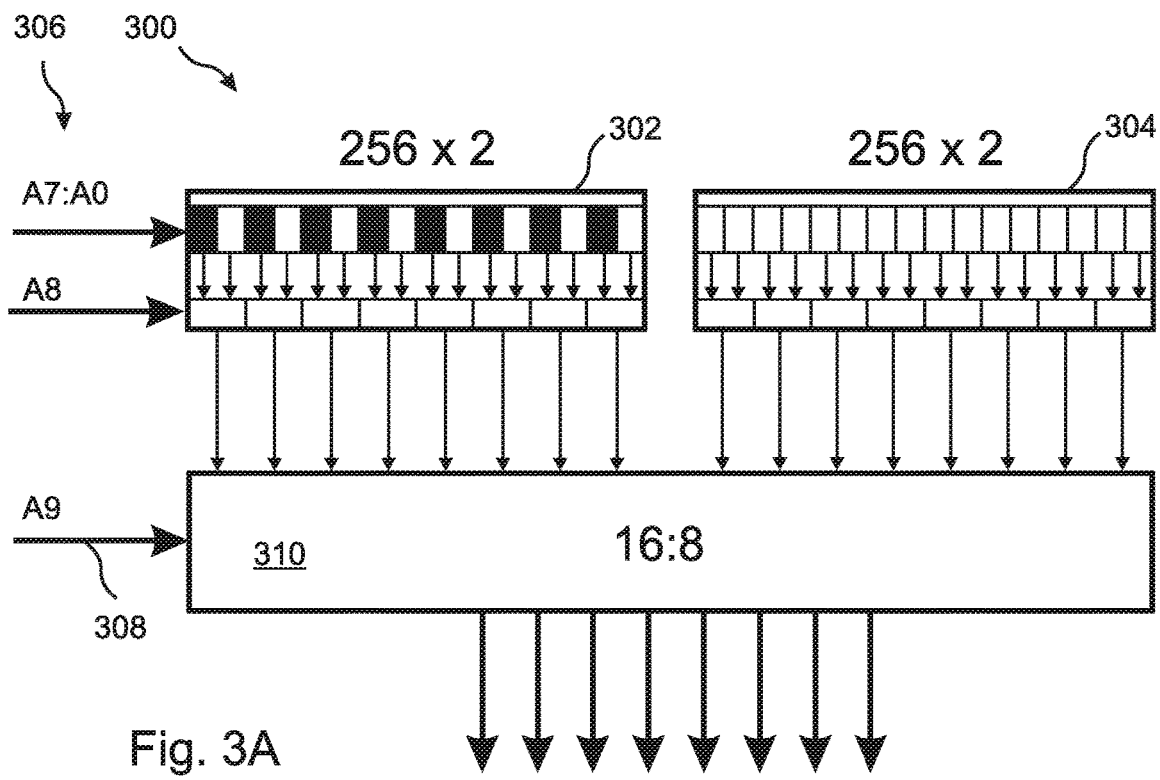
FIG. 3A illustrates a 1 Kbyte memory of the prior art that includes two chips having a capacity of 512 bytes each.

With reference to FIG. 3A, a conventional 1 Kbyte memory 300 could comprise two chips 302, 304, each having a capacity of 512 bytes, organized as 256 rows and 16 columns, i.e. with a column mux of 2, whereby the first chip 302 stores the first 512 words of the memory 300, and the second chip 304 stores the second 512 words of the memory. The lowest 9 addressing bits 306 could be routed to each of the two chips 302, 304, and the highest order addressing bit 308 could be directed to an external 16:8 selecting device 310 so as to select which of the chip outputs should be accessed. According to this approach, the spacing between bits belonging to a given word would be determined by the column mux of the individual chips 302, 304, which in FIG. 3A is two.

Figure 3B:
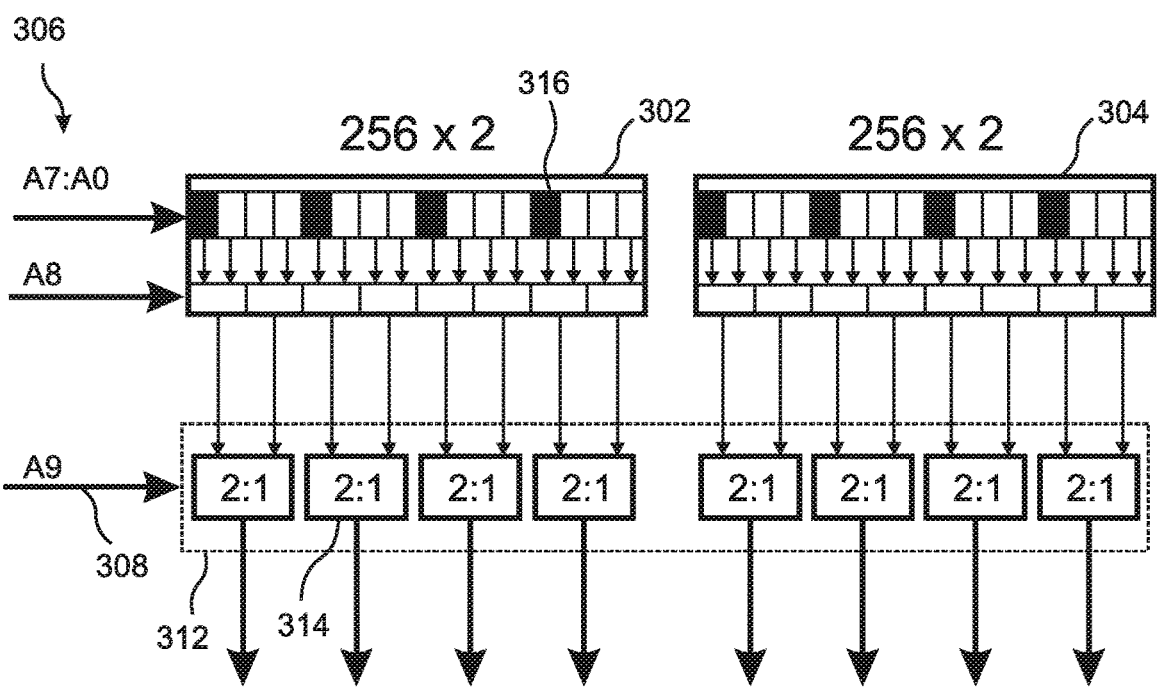
FIG. 3B illustrates application of a bit selection layer in an embodiment of the present system that operationally converts each of the chips of FIG. 3A into a 1 K×4 bit memory device.

Instead of the conventional approach illustrated in FIG. 3A, in embodiments of the present disclosure, as illustrated in FIG. 3B, the external 16:8 selecting device 310 is replaced by a bit selection layer 312 comprising eight 2:1 select devices, essentially converting each of the chips into an 1 K×4 bit memory device. As a result, only 4 bits are selected by the bit section layer 312 from each of the two chips 302, 304, with both chips 302, 304 contributing to each word that is accessed. The net memory capacity is the same as in FIG. 3A, the bit selection logic 312 is different from the 16:8 sect 310 in FIG. 3A, but is similar in complexity, and each of the bits belonging to each word is separated from its neighbors by four columns instead of two, as can be seen from the blackened squares 316 in the figure.

Figure 1:
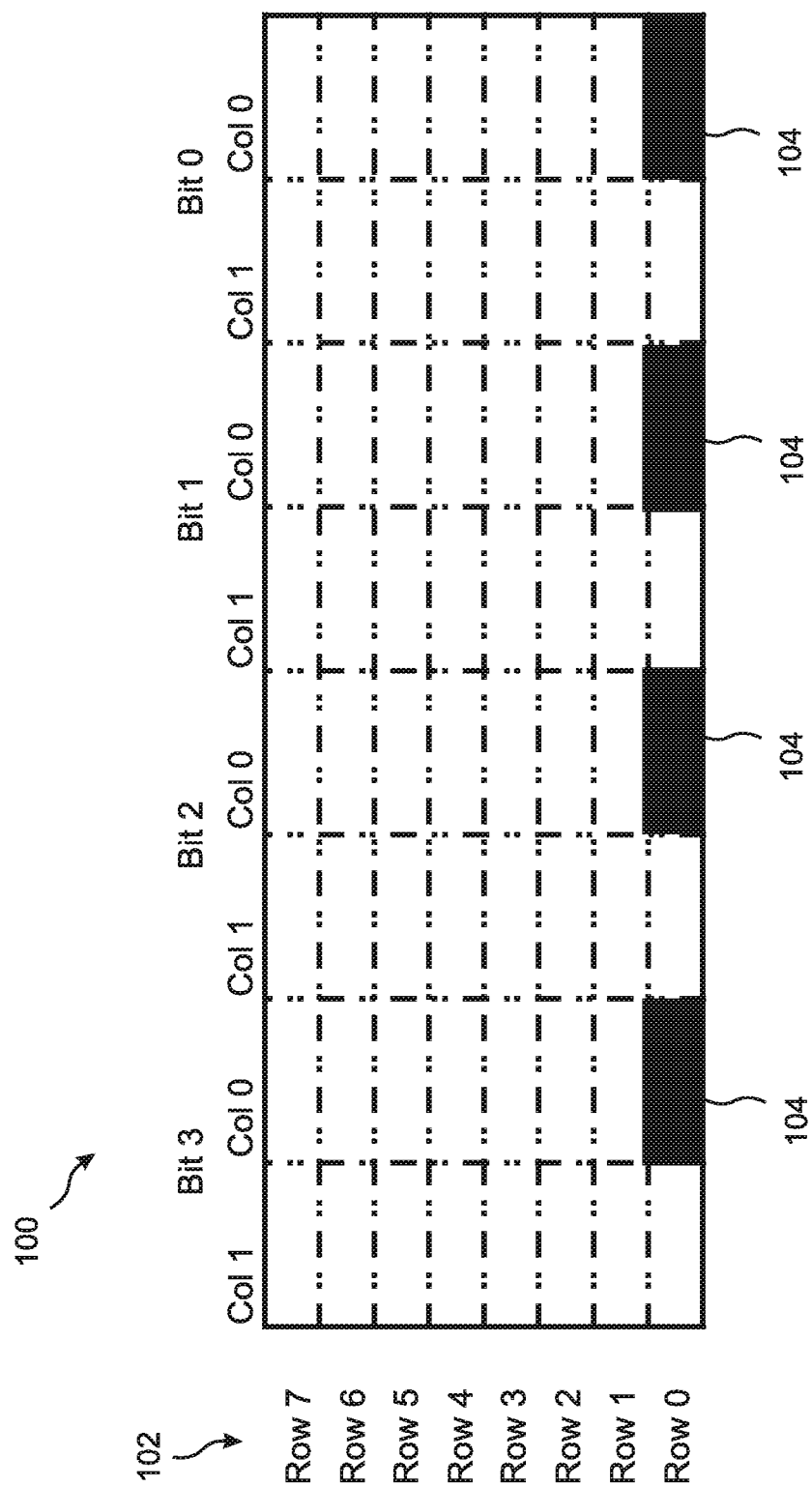
FIG. 1 illustrates storage of data in a bit table having 8 rows and 8 columns, where 2 columns are assigned to each bit, according to a memory device of the prior art.
Figure 2:
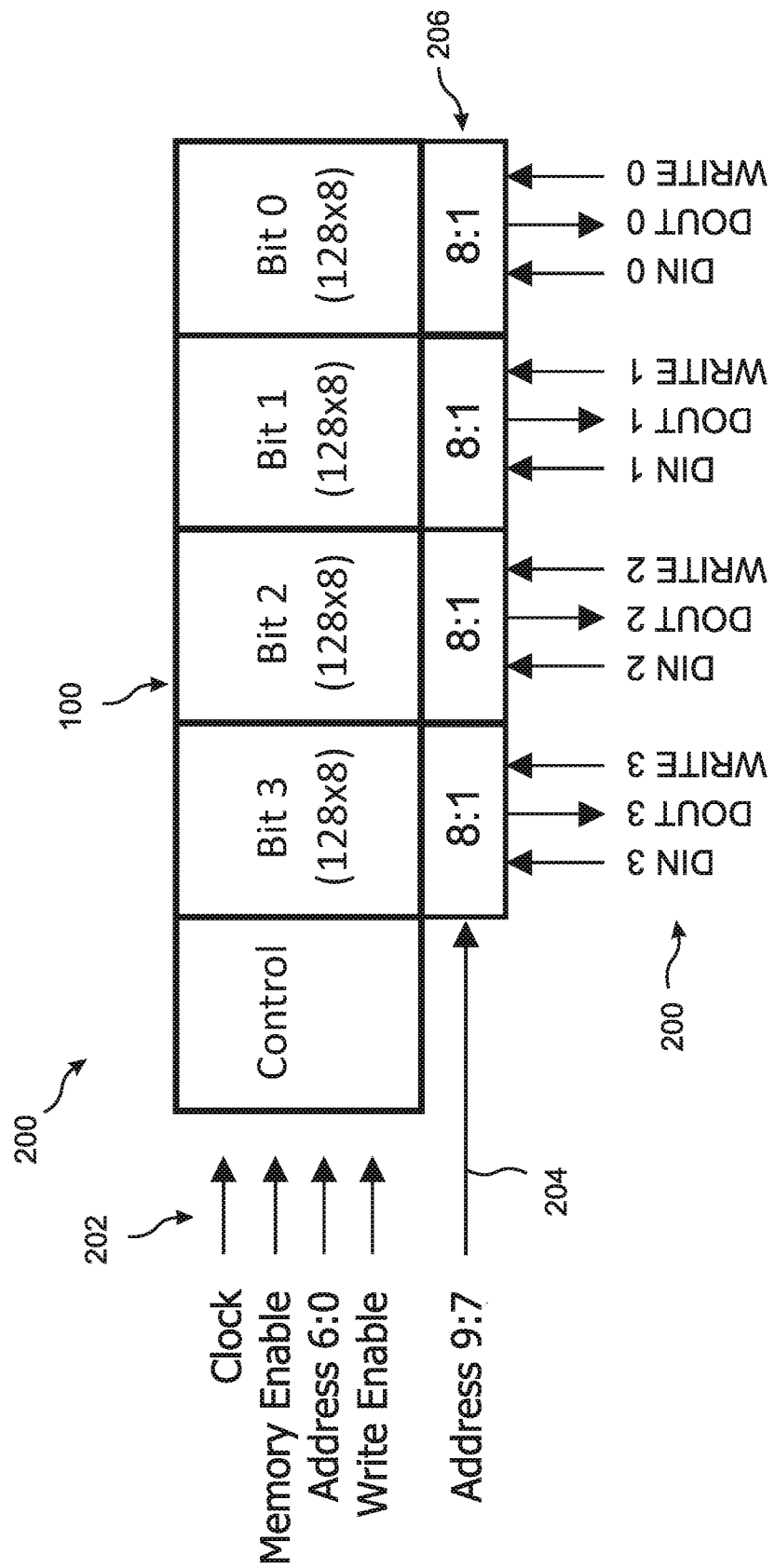
FIG. 2 illustrates an example of a memory device that comprises a bit table having 128 rows and 32 columns, wherein 8 columns are assigned to each bit, according to a memory device of the prior art.
Figure 4A:
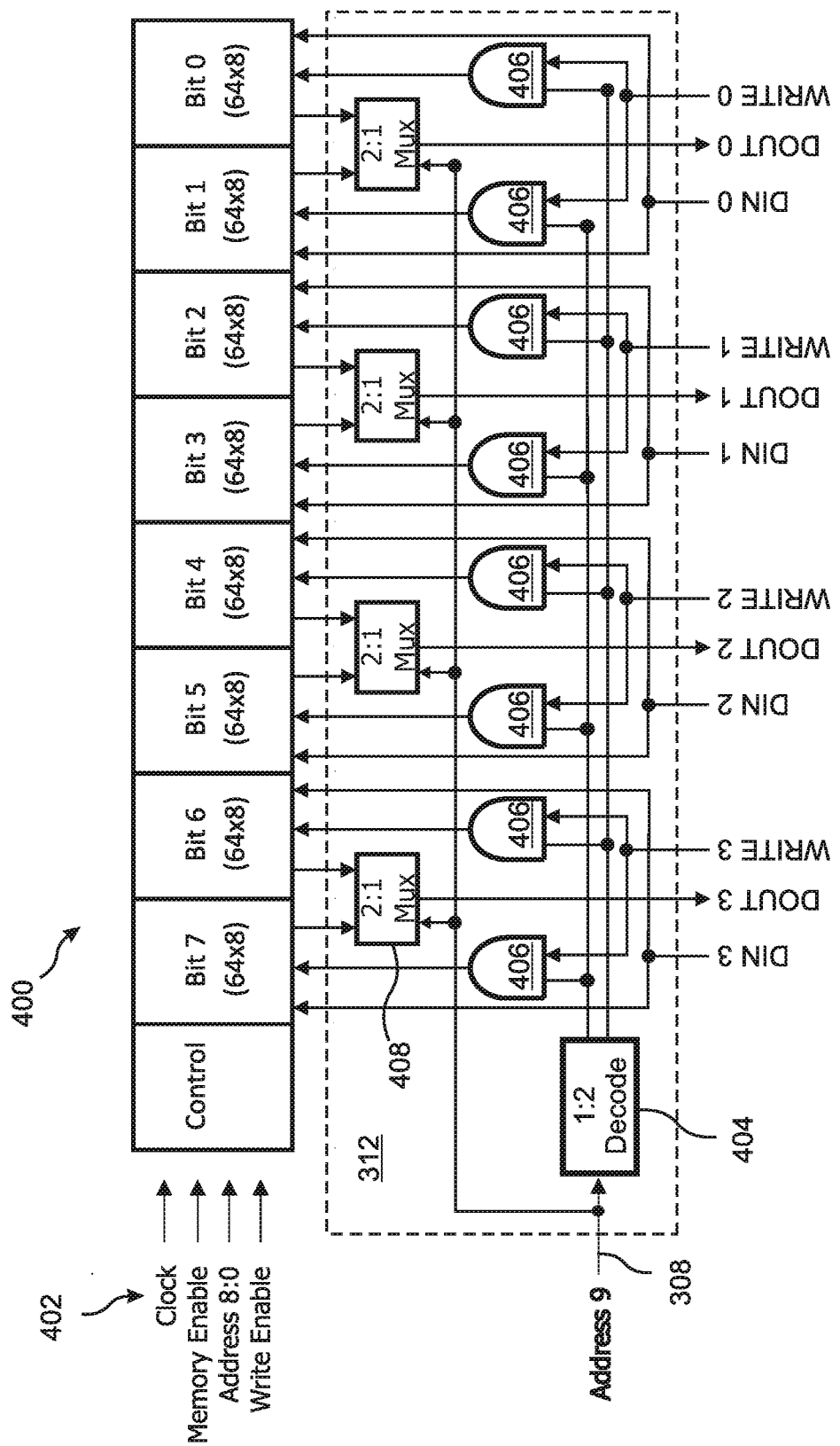
FIG. 4A is a detailed illustration of an embodiment of the present disclosure wherein the memory device includes eight columns per bit (column mux=8), and provides individual read/write access to each bit.

FIG. 4A illustrates an embodiment in more detail, wherein the memory device 400 includes eight columns per bit (column mux=8). The figure indicates various control lines 402 that are included, such as a clock input, memory enable, and write enable, in addition to addressing bits. The internal logic that selects the required bit from among the eight columns for each memory access is not shown in the figure, but is similar to element 206 in FIG. 2. As in FIG. 3B, the highest order address bit A9 308 is used to control the bit selection layer 312. In the illustrated example, a 1:2 decoder 404 is controlled by A9, whereby the output of the decoder 404 controls eight gates 406 that determine which inputs of the memory device 400 are enabled when writing to the device 400, while the A9 bit 308 also controls four 2:1 select units 408 that determine which of the outputs are selected when reading from the device 400. Functionally, the effect of the bit selection layer 312 is to convert the device 400 from a 1 Kbyte memory to a 2 K "nibble" (4-bit) memory, whereby the physical spacing between the locations where bits are stored for any given 4-bit input is doubled. It will be clear that two of these devices could be combined as illustrated in FIG. 3B to form a 2 Kbyte memory.

Figure 4B:
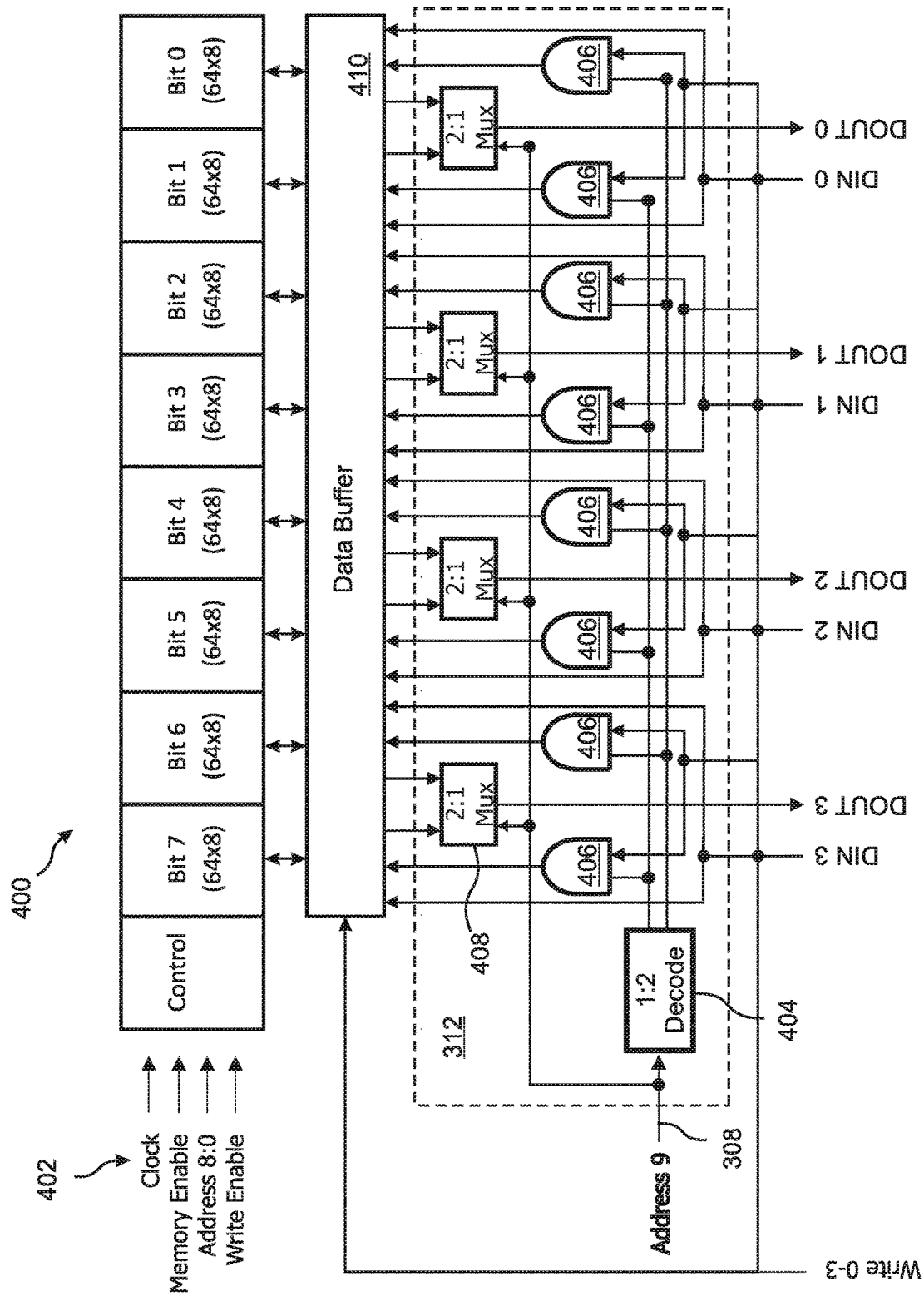
FIG. 4B is a detailed illustration of an embodiment similar to FIG. 4A, wherein the memory device wherein the memory device does not provide individual read/write access to each bit.

FIG. 4B illustrates an embodiment similar to the embodiment of FIG. 4A, but wherein the memory device 400 does not allow separate read/write control of individual bits. Instead, in this embodiment an 8-bit buffer or latch 410 that does provide separate read/write control of each bit is configured to read and write entire 8-bit "bytes" to and from the memory device 400. When reading data from the memory device 400, the operation is essentially the same as in FIG. 4A, with the buffer 410 simply passing the data through from the memory device 400. When writing to the memory device, an entire byte is first read from the memory device 400, after which data is written to a selected 4 bits of the buffer 410, while the remaining 4 bits remain latched and unchanged. Finally, the modified byte is written as a whole back to the memory device 400.

Figure 5:
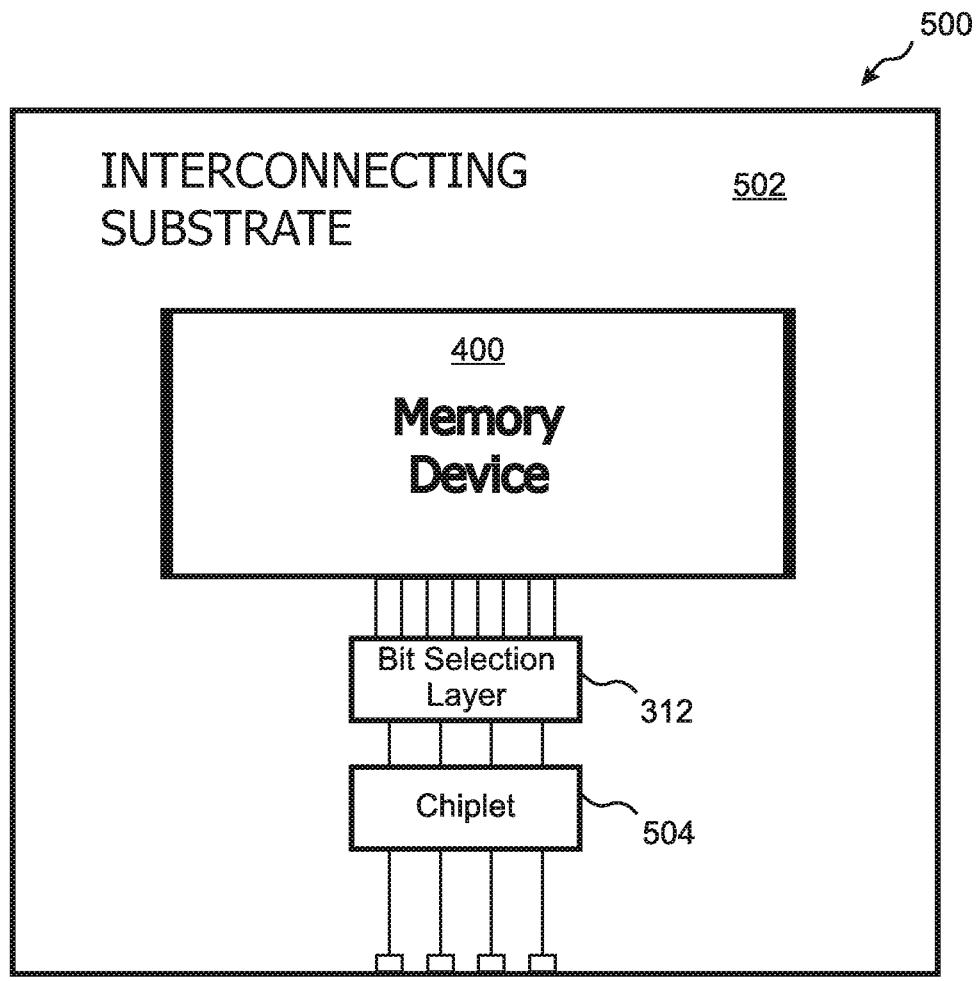
FIG. 5 illustrates an embodiment wherein the present disclosure is implemented in a multi-chip module ("MCM") hybrid integrated circuit ("HIC").

With reference to FIG. 5, in embodiments the memory device is a "core IC" 400, or a memory macro incorporated in a core IC 400, that is included in a multi-chip module ("MCM") hybrid integrated circuit ("HIC") 500, and the bit selection layer is implemented in a chiplet 312 included in the same MCM-HIC 500 and interconnected with the memory device by an interconnecting substrate 502 of the MCM-HIC.

As is disclosed in more detail in U.S. application Ser. No. 16/057,204, MCM-HIC devices represent a flexible approach to enhancing and/or modifying the functionality of an existing "core" IC, typically a VLSI IC or other high density, high complexity IC, in cases where the quantity requirements of an application do not justify designing and manufacturing a new high density circuit. According to the MCM-HIC approach, one or more existing core ICs are installed on an interconnecting substrate together with at least one "chiplet" that provides the required features and/or adaptations that are lacking from the core ICs. Often, the chiplets are interposed between the core IC(s) and the inputs and outputs of the MCM-HIC. The chiplets are typically lower density, lower complexity circuits that can be economically designed and manufactured in lower quantities as needed. Often, a new requirement can be met simply by designing a new substrate that will provide the required interconnections between existing core ICs and previously designed chiplets.

It should be understood that the number of input/output signal lines illustrated in FIG. 5, and the relative numbers of signal lines that are shown as being directed to and from the bit selection layer, are only representative, and are not limiting. In general, input and output lines can be separate or bi-directional, and additional control lines may also be included. In various embodiments, the memory device 400 operates as described with respect to FIG. 4a or 4b, but with multi-bit buffers and multi-columns per bit. Embodiments further include additional chiplets 504, for example to provide voltage or current translations, and/or to provide support of cold spare operation. In particular, withdrawing power from a non-volatile memory device or macro such as a NAND or NOR FLASH, MRAM, CRAM, or FeRAM memory when not in use can further reduce the likelihood of SEU errors due to radiation impacts. It should be noted, however, that the present disclosure applies to both non-volatile memory and to volatile memory devices and macros such as DRAM, SRAM.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the disclosure is not limited to just these forms, but is amenable to various changes and modifications without departing from the spirit thereof. The disclosure presented herein does not explicitly disclose all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

I claim:

1. A memory apparatus having a reduced likelihood of multiple bit single event upset (SEU) errors, the memory apparatus comprising:
    a memory configured to store bits within a bit table having a column multiplexer M, where M is an integer, said memory including data bit outputs and data bit inputs; and
    a bit selection layer having s layer address bit inputs, where s is an integer, external to the memory and cooperative with the data bit outputs and the data bit inputs, the bit selection layer being configured to increase an effective column multiplexer of the bit table, so that for each word of data stored in the bit table, a physical separation between bits belonging to each word is increased by a selection factor D=2 raised to the power of s.

2. The apparatus of claim 1, wherein:
    the memory is configured for storing N words, where N=2 raised to the power n, each of the words having a bit width L;
    the memory comprises:
        n memory address bit inputs;
        L memory data bit outputs;
        L memory data bit inputs; and
    the bit table has R rows and C columns, wherein N×L=R×C, where a column multiplexer M of the bit table satisfies a relation M=N/R, the columns being organized into a plurality of adjacent groups of M columns each, such that storage of a word in the memory includes storage of the word in a selected row of the bit table with the bits of the word being stored in each of L consecutive column groups of the plurality of column groups;
    the bit selection layer is in data communication with the L memory data bit outputs and L memory data bit inputs of the memory, the bit selection layer having the selection factor D=2 raised to the power s;
    the bit selection layer comprises:
        s bit selection layer address bit inputs;
        S bit selection layer data inputs, where S=L/D; and
        S bit selection layer data outputs; and
    the bit selection layer is configured to:
        select one of the L memory data bit inputs and outputs from each consecutive group of D memory data bit inputs and outputs respectively according to bit selection address bits applied to the bit selection layer address bit inputs;
        direct write bits presented to the bit selection layer data inputs to the selected L memory data bit inputs; and
        direct read bits from the selected L memory data bit outputs to the bit selection layer data outputs
    wherein N, L, n, R, C, M, D, s, and S are all integers.

3. The apparatus of claim 1, further comprising a buffer layer interposed between the bit selection layer and the memory, the buffer layer being configured to read, write, and store an entire word to and from the memory, the buffer layer providing individual write control of each bit of the entire word.

4. The apparatus of claim 1, wherein the memory is a DRAM, SRAM, NAND/NOR FLASH, MRAM, CRAM, or FeRAM memory.

5. The apparatus of claim 1, wherein the apparatus comprises a plurality of the memories and a corresponding plurality of the bit selection layers.

6. The apparatus of claim 1, wherein the memory is implemented in a core integrated circuit (IC) within a multi-chip module (MCM) hybrid integrated circuit (HIC), and the bit selection layer is implemented in a chiplet that is also installed within the MCM-HIC.

7. The apparatus of claim 6, wherein the memory is a non-volatile memory, and wherein the MCM-HIC further implements cold spare operation by withdrawing power from the core integrated circuit (IC) when the core IC is not in use.

8. A method of reducing a likelihood of radiation-induced multi-bit single event upset (SEU) errors of a memory apparatus that includes a plurality of memories that are selectable according to at least one memory selection addressing bit, the method comprising:
    for each of the memories, providing a bit selection layer external to each of the memories that is configured to select a subset of inputs and outputs of the memory for data input and output according to at least one layer addressing bit applied to a layer address input of the bit selection layer; and
    redirecting at least one of the memory selection addressing bits to the layer address input, so as to control the selections of the subsets of inputs and outputs of the memory by each of the external bit selection layers,
    wherein the memories are implemented in a core integrated circuit (IC) included in a multi-chip module (MCM) hybrid integrated circuit (HIC), and wherein the bit selection layer is implemented in a chiplet that is also installed within the MCM-HIC.

9. The method of claim 8, wherein:
each of the memories is configured for storing N words, where N=2 raised to the power n, each of the N words having a bit width L;
each of the memories comprises:
  n memory address bit inputs;
  L memory data bit outputs;
  L memory data bit inputs; and
the bit table has R rows and C columns, wherein N×L=R×C, where the column multiplexer M of the bit table satisfies the relation M=N/R, the columns being organized into a plurality of adjacent groups of M columns each, such that storage of a word in each of the memories includes storage of the word in a selected row of the bit table with the bits of the word being stored in each of L consecutive column groups of the plurality of column groups;
the bit selection layer is in data communication with the L memory data bit outputs and L memory data bit inputs of the memory, the bit selection layer having a selection factor D=2 raised to the power s;
each of the bit selection layers comprises:
  s bit selection layer address bit inputs;
  S bit selection layer data inputs, where S=L/D; and
  S bit selection layer data outputs; and
each of the bit selection layers is configured to:
  select one of the L memory data bit inputs and outputs from each consecutive group of D memory data bit inputs and outputs respectively according to bit selection address bits applied to the bit selection layer address bit inputs;
  direct write bits presented to the bit selection layer data inputs to the selected L memory data bit inputs; and
  direct read bits from the selected L memory data bit outputs to the bit selection layer data outputs
wherein N, L, n, R, C, M, D, s, and S are all integers.

10. The method of claim 8, further comprising buffer layers interposed between the bit selection layers and the corresponding memories, each of the buffer layers being configured to read, write, and store an entire word to and from the corresponding memory while providing individual write control of each bit of the word, and wherein writing a word to one of the memories includes:
  reading a word from the memory into each of the buffer layers;
  altering the word in each of the buffer layers by changing selected bits of the word in the buffer layer; and
  writing the altered word from each of the buffer layers into the memory.

11. The method of claim 8, wherein each of the memories is a DRAM, SRAM, NAND/NOR FLASH, MRAM, CRAM, or FeRAM memory.

12. The method of claim 8, wherein the memories are a non-volatile memory, and wherein the MCM-HIC further implements cold spare operation by withdrawing power from the core integrated circuit (IC) when it is not in use.

* * * * *